(12) United States Patent
Iyengar et al.

(10) Patent No.: US 10,548,240 B1
(45) Date of Patent: Jan. 28, 2020

(54) COOLING ELECTRONIC DEVICES IN A DATA CENTER

(71) Applicant: Google LLC, Mountain View, CA (US)

(72) Inventors: Madhusudan Krishnan Iyengar, Foster City, CA (US); Christopher Gregory Malone, Mountain View, CA (US); Yuan Li, Sunnyvale, CA (US); Jorge Padilla, Union City, CA (US); Woon-Seong Kwon, Santa Clara, CA (US); Teckgyu Kang, Saratoga, CA (US); Norman Paul Jouppi, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/246,013

(22) Filed: Jan. 11, 2019

(51) Int. Cl.
*H05K 7/20* (2006.01)
*F28F 3/02* (2006.01)
*H01L 23/473* (2006.01)

(52) U.S. Cl.
CPC ......... *H05K 7/20254* (2013.01); *F28F 3/022* (2013.01); *H01L 23/473* (2013.01); *H05K 7/20509* (2013.01); *H05K 7/20772* (2013.01); *F28F 2215/00* (2013.01)

(58) Field of Classification Search
CPC ........... H05K 7/20236; H05K 7/20254; H05K 7/203; H05K 7/20309; H05K 7/20327; H05K 7/20636; H05K 7/20672; H05K 7/20772; H01L 23/473
See application file for complete search history.

(56) References Cited

U.S. PATENT DOCUMENTS

| 5,774,334 | A | 6/1998 | Kawamura |
| 6,292,365 | B1 | 9/2001 | Ashiwake |
| 6,317,326 | B1 | 11/2001 | Vogel |
| 6,388,882 | B1 | 5/2002 | Hoover et al. |
| 6,952,346 | B2 * | 10/2005 | Tilton ................ H05K 7/20345 165/80.4 |
| 6,973,801 | B1 | 12/2005 | Campbell et al. |
| 7,086,247 | B2 | 8/2006 | Campbell et al. |
| 7,233,494 | B2 | 6/2007 | Campbell et al. |
| 7,272,005 | B2 | 9/2007 | Campbell et al. |

(Continued)

OTHER PUBLICATIONS

PCT International Search Report and Written Opinion in International Application No. PCT/US2019/028109, dated Jun. 28, 2019, 16 pages.

(Continued)

*Primary Examiner* — Robert J Hoffberg
(74) *Attorney, Agent, or Firm* — Fish & Richardson P.C.

(57) ABSTRACT

A server tray package includes a motherboard assembly that includes a plurality of data center electronic devices; and a liquid cold plate assembly. The liquid cold plate assembly includes a base portion mounted to the motherboard assembly, the base portion and motherboard assembly defining a volume that at least partially encloses the plurality of data center electronic devices; and a top portion mounted to the base portion and including a heat transfer member that includes a first number of inlet ports and a second number of outlet ports that are in fluid communication with a cooling liquid flow path defined through the heat transfer member, the first number of inlet ports being different that the second number of outlet ports.

20 Claims, 9 Drawing Sheets

(56) References Cited

U.S. PATENT DOCUMENTS

| | | | |
|---|---|---|---|
| 7,274,566 B2 | 9/2007 | Campbell et al. |
| 7,277,283 B2 | 10/2007 | Campbell et al. |
| 7,298,617 B2 | 11/2007 | Campbell et al. |
| 7,298,618 B2 | 11/2007 | Campbell et al. |
| 7,301,770 B2 | 11/2007 | Campbell et al. |
| 7,349,213 B2 | 3/2008 | Campbell et al. |
| 7,362,574 B2 | 4/2008 | Campbell et al. |
| 7,375,962 B2 | 5/2008 | Campbell et al. |
| 7,380,409 B2 | 6/2008 | Campbell et al. |
| 7,385,817 B2 | 6/2008 | Campbell et al. |
| 7,400,504 B2 | 7/2008 | Campbell et al. |
| 7,400,505 B2 | 7/2008 | Campbell et al. |
| 7,405,936 B1 | 7/2008 | Campbell et al. |
| 7,408,776 B2 | 8/2008 | Campbell et al. |
| 7,420,808 B2 | 9/2008 | Campbell et al. |
| 7,450,385 B1 | 11/2008 | Campbell et al. |
| 7,486,514 B2 | 2/2009 | Campbell et al. |
| 7,511,957 B2 | 3/2009 | Campbell et al. |
| 7,516,776 B2 * | 4/2009 | Bezama | H01L 23/4735 165/80.4 |
| 7,518,871 B2 | 4/2009 | Campbell et al. |
| 7,593,227 B2 | 9/2009 | Campbell et al. |
| 7,609,519 B2 | 10/2009 | Campbell et al. |
| 7,639,498 B2 | 12/2009 | Campbell et al. |
| 7,639,499 B1 | 12/2009 | Campbell et al. |
| 7,641,101 B2 | 1/2010 | Campbell et al. |
| 7,651,260 B2 | 1/2010 | Hamann et al. |
| 7,665,325 B2 | 3/2010 | Campbell et al. |
| 7,724,524 B1 | 5/2010 | Campbell et al. |
| 7,731,079 B2 | 6/2010 | Campbell et al. |
| 7,762,314 B2 | 7/2010 | Campbell et al. |
| 7,787,248 B2 | 8/2010 | Campbell et al. |
| 7,791,882 B2 | 9/2010 | Chu et al. |
| 7,808,780 B2 * | 10/2010 | Brunschwiler | G06F 1/20 165/104.33 |
| 7,808,781 B2 * | 10/2010 | Colgan | H01L 23/473 165/80.4 |
| 7,830,664 B2 | 11/2010 | Campbell et al. |
| 7,841,385 B2 | 11/2010 | Campbell et al. |
| 7,885,074 B2 | 2/2011 | Campbell et al. |
| 7,905,096 B1 | 3/2011 | Campbell et al. |
| 7,907,406 B1 | 3/2011 | Campbell et al. |
| 7,916,483 B2 | 3/2011 | Campbell et al. |
| 7,948,757 B2 | 5/2011 | Campbell et al. |
| 7,963,119 B2 | 6/2011 | Campbell et al. |
| 7,965,509 B2 | 6/2011 | Campbell et al. |
| 7,967,062 B2 | 6/2011 | Campbell et al. |
| 7,978,472 B2 | 7/2011 | Campbell et al. |
| 7,978,473 B2 | 7/2011 | Campbell et al. |
| 7,990,709 B2 | 8/2011 | Campbell et al. |
| 7,992,627 B2 * | 8/2011 | Bezama | H01L 23/4735 165/80.4 |
| 8,004,832 B2 * | 8/2011 | Brunschwiler | G06F 1/20 165/104.33 |
| 8,014,150 B2 | 9/2011 | Campbell et al. |
| 8,018,720 B2 | 9/2011 | Campbell et al. |
| 8,027,162 B2 | 9/2011 | Campbell et al. |
| 8,029,186 B2 | 10/2011 | Hamann et al. |
| 8,038,343 B2 | 10/2011 | Hamann et al. |
| 8,051,897 B2 | 11/2011 | Campbell et al. |
| 8,056,615 B2 * | 11/2011 | Downing | F28D 15/0233 165/80.4 |
| 8,059,405 B2 | 11/2011 | Campbell et al. |
| 8,077,462 B2 | 12/2011 | Barringer et al. |
| 8,094,453 B2 | 1/2012 | Campbell et al. |
| 8,144,467 B2 | 3/2012 | Campbell et al. |
| 8,179,674 B2 | 5/2012 | Carter et al. |
| 8,179,677 B2 | 5/2012 | Campbell et al. |
| 8,189,334 B2 | 5/2012 | Campbell et al. |
| 8,194,406 B2 | 6/2012 | Campbell et al. |
| 8,203,842 B2 | 6/2012 | Campbell et al. |
| 8,208,258 B2 | 6/2012 | Campbell et al. |
| 8,210,741 B2 | 7/2012 | Hamann et al. |
| 8,230,906 B2 | 7/2012 | Campbell et al. |
| 8,248,801 B2 | 8/2012 | Campbell et al. |
| 8,266,802 B2 | 9/2012 | Campbell et al. |
| 8,274,790 B2 | 9/2012 | Campbell et al. |
| 8,279,597 B2 | 10/2012 | El-Essawy et al. |
| 8,322,029 B2 | 12/2012 | Campbell et al. |
| 8,322,154 B2 | 12/2012 | Campbell et al. |
| 8,345,423 B2 | 1/2013 | Campbell et al. |
| 8,358,503 B2 | 1/2013 | Carter et al. |
| 8,369,091 B2 | 2/2013 | Campbell et al. |
| 8,387,249 B2 | 3/2013 | Campbell et al. |
| 8,437,129 B2 | 5/2013 | Tung |
| 8,472,182 B2 | 6/2013 | Campbell et al. |
| 8,490,679 B2 | 7/2013 | Campbell et al. |
| 8,493,738 B2 | 7/2013 | Chainer et al. |
| 8,547,692 B2 | 10/2013 | El-Essawy et al. |
| 8,564,952 B2 * | 10/2013 | Campbell | H05K 7/20309 165/80.4 |
| 8,583,290 B2 | 11/2013 | Campbell et al. |
| 8,619,425 B2 | 12/2013 | Campbell et al. |
| 8,636,406 B2 | 1/2014 | Hamann et al. |
| 8,649,177 B2 | 2/2014 | Chainer et al. |
| 8,659,898 B2 * | 2/2014 | Brunschwiler | H01L 23/473 165/80.4 |
| 8,687,364 B2 | 4/2014 | Chainer et al. |
| 8,689,861 B2 | 4/2014 | Campbell et al. |
| 8,711,563 B2 | 4/2014 | Campbell et al. |
| 8,713,955 B2 | 5/2014 | Campbell et al. |
| 8,713,957 B2 | 5/2014 | Campbell et al. |
| 8,739,406 B2 | 6/2014 | Campbell et al. |
| 8,743,545 B2 | 6/2014 | Campbell et al. |
| 8,760,863 B2 | 6/2014 | Campbell et al. |
| 8,783,052 B2 | 7/2014 | Campbell et al. |
| 8,789,385 B2 | 7/2014 | Campbell et al. |
| 8,797,740 B2 | 8/2014 | Campbell et al. |
| 8,806,749 B2 | 8/2014 | Campbell et al. |
| 8,813,515 B2 | 8/2014 | Campbell et al. |
| 8,817,465 B2 | 8/2014 | Campbell et al. |
| 8,817,474 B2 | 8/2014 | Campbell et al. |
| 8,824,143 B2 | 9/2014 | Campbell et al. |
| 8,833,096 B2 | 9/2014 | Campbell et al. |
| 8,879,257 B2 | 11/2014 | Campbell et al. |
| 8,899,052 B2 | 12/2014 | Campbell et al. |
| 8,913,384 B2 | 12/2014 | David et al. |
| 8,922,998 B2 | 12/2014 | Campbell et al. |
| 8,925,333 B2 | 1/2015 | Campbell et al. |
| 8,929,080 B2 | 1/2015 | Campbell et al. |
| 8,934,250 B2 | 1/2015 | Campbell et al. |
| 8,941,994 B2 | 1/2015 | Campbell et al. |
| 8,947,873 B2 | 2/2015 | Campbell et al. |
| 8,953,317 B2 | 2/2015 | Campbell et al. |
| 8,955,346 B2 | 2/2015 | Campbell et al. |
| 8,964,390 B2 | 2/2015 | Campbell et al. |
| 8,964,391 B2 | 2/2015 | Campbell et al. |
| 8,966,922 B2 | 3/2015 | Campbell et al. |
| 8,985,847 B2 | 3/2015 | Campbell et al. |
| 9,009,968 B2 | 4/2015 | Campbell et al. |
| 9,009,971 B2 | 4/2015 | Campbell et al. |
| 9,013,872 B2 | 4/2015 | Campbell et al. |
| 9,027,360 B2 | 5/2015 | Chainer et al. |
| 9,038,406 B2 | 5/2015 | Campbell et al. |
| 9,043,035 B2 | 5/2015 | Chainer et al. |
| 9,045,995 B2 | 6/2015 | Graybill et al. |
| 9,052,722 B2 | 6/2015 | Chainer et al. |
| 9,078,379 B2 * | 7/2015 | Campbell | H05K 7/20309 |
| 9,095,889 B2 | 8/2015 | Campbell et al. |
| 9,095,942 B2 | 8/2015 | Campbell et al. |
| 9,101,078 B2 | 8/2015 | Campbell et al. |
| 9,110,476 B2 | 8/2015 | David et al. |
| 9,148,982 B2 | 9/2015 | Campbell et al. |
| 9,148,983 B2 | 9/2015 | Campbell et al. |
| 9,167,721 B2 | 10/2015 | Campbell et al. |
| 9,173,324 B2 | 10/2015 | Campbell et al. |
| 9,179,574 B2 | 11/2015 | Canney et al. |
| 9,185,830 B2 | 11/2015 | Chainer et al. |
| 9,200,851 B2 | 12/2015 | Campbell et al. |
| 9,207,002 B2 | 12/2015 | Campbell et al. |
| 9,210,830 B2 | 12/2015 | Campbell et al. |
| 9,213,343 B2 | 12/2015 | Campbell et al. |
| 9,218,008 B2 | 12/2015 | Campbell et al. |

(56) References Cited

U.S. PATENT DOCUMENTS

| | | |
|---|---|---|
| 9,250,024 B2 | 2/2016 | Campbell et al. |
| 9,253,921 B2 | 2/2016 | Campbell et al. |
| 9,261,308 B2 | 2/2016 | Campbell et al. |
| 9,282,675 B2 | 3/2016 | Campbell et al. |
| 9,282,678 B2 | 3/2016 | Campbell et al. |
| 9,285,050 B2 | 3/2016 | Campbell et al. |
| 9,288,932 B2 | 3/2016 | Campbell et al. |
| 9,291,281 B2 | 3/2016 | Campbell et al. |
| 9,295,181 B2 | 3/2016 | Campbell et al. |
| 9,301,433 B2 | 3/2016 | Campbell et al. |
| 9,303,926 B2 | 4/2016 | Campbell et al. |
| 9,307,674 B2 | 4/2016 | Chainer et al. |
| 9,313,920 B2 | 4/2016 | Campbell et al. |
| 9,332,674 B2 | 5/2016 | Campbell et al. |
| 9,338,924 B2 | 5/2016 | Campbell et al. |
| 9,342,079 B2 | 5/2016 | David et al. |
| 9,351,431 B2 | 5/2016 | Campbell et al. |
| 9,357,674 B2 | 5/2016 | Campbell et al. |
| 9,357,675 B2 | 5/2016 | Campbell et al. |
| 9,357,682 B2 | 5/2016 | Campbell et al. |
| 9,363,924 B2 | 6/2016 | Campbell et al. |
| 9,386,727 B2 | 7/2016 | Barringer et al. |
| 9,410,751 B2 | 8/2016 | David et al. |
| 9,414,519 B2 | 8/2016 | Campbell et al. |
| 9,414,523 B2 | 8/2016 | Chainer et al. |
| 9,414,525 B2 | 8/2016 | Campbell et al. |
| 9,439,325 B2 | 9/2016 | Campbell et al. |
| 9,445,529 B2 | 9/2016 | Chainer et al. |
| 9,460,985 B2 * | 10/2016 | Joshi .................. H01L 23/4735 |
| 9,470,439 B2 | 10/2016 | Campbell et al. |
| 9,474,186 B2 | 10/2016 | Campbell et al. |
| 9,518,875 B2 | 12/2016 | Chainer et al. |
| 9,655,282 B2 | 5/2017 | Barringer et al. |
| 9,686,889 B2 | 6/2017 | Campbell et al. |
| 9,719,865 B2 | 8/2017 | Chainer et al. |
| 9,750,159 B2 | 8/2017 | Campbell et al. |
| 9,763,357 B2 | 9/2017 | Campbell et al. |
| 9,831,151 B1 | 11/2017 | Schultz |
| 9,879,926 B2 | 1/2018 | David et al. |
| 2003/0147214 A1 | 8/2003 | Patel et al. |
| 2004/0061218 A1 | 4/2004 | Tilton |
| 2007/0023879 A1 | 2/2007 | Pandey et al. |
| 2007/0121295 A1 | 5/2007 | Campbell et al. |
| 2007/0125523 A1 | 6/2007 | Bhatti et al. |
| 2009/0140417 A1 | 6/2009 | Refai-Ahmed |
| 2009/0218078 A1 | 9/2009 | Brunschwiler et al. |
| 2010/0252234 A1 | 10/2010 | Campbell |
| 2011/0240281 A1 | 10/2011 | Avery |
| 2013/0027878 A1 | 1/2013 | Campbell |
| 2013/0027884 A1 | 1/2013 | Campbell et al. |
| 2014/0015106 A1 | 1/2014 | Hsieh |
| 2014/0085817 A1 | 3/2014 | Campbell et al. |
| 2014/0146467 A1 | 5/2014 | Campbell |
| 2015/0319883 A1 | 11/2015 | Branton |
| 2017/0127565 A1 | 5/2017 | Campbell |
| 2018/0005921 A1 | 1/2018 | Takemura et al. |
| 2018/0090417 A1 | 3/2018 | Gutala |
| 2018/0211900 A1 | 7/2018 | Gutala |
| 2019/0103290 A1 | 4/2019 | Medina |
| 2019/0206764 A1 | 7/2019 | Kulkarni |

OTHER PUBLICATIONS

PCT International Search Report and Written Opinion in International Application No. PCT/US2019/027909, dated Aug. 13, 2019, 14 pages.

Alavi et al. "Fabrications of microchannels by laser machining and anisotropic," Sensor and Actuators A: Physical, vol. 32, Issues 1-3, Apr. 1992, 4 pages.

* cited by examiner

COOLING ELECTRONIC DEVICES IN A DATA CENTER

TECHNICAL FIELD

This document relates to systems and methods for providing cooling to electronic equipment, such as computer server racks and related equipment in computer data centers, with a cold plate.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

This disclosure describes a cooling system, for example, for rack mounted electronic devices (e.g., servers, processors, memory, networking devices or otherwise) in a data center is disclosed. In various disclosed implementations, the cooling system may be or include a liquid cold plate assembly that is part of or integrated with a server tray package. In some implementations, the liquid cold plate assembly includes a base portion and a top portion that, in combination, form a cooling liquid flow path through which a cooling liquid is circulated and a thermal interface between one or more heat generating devices and the cooling liquid. The top portion of the liquid cold plate assembly may include multiple inlets and/or multiple outlets to customize a flow path through which a liquid coolant flows to cool the electronic devices in conductive thermal contact with the cold plate assembly.

In an example implementation, a server tray package includes a motherboard assembly that includes a plurality of data center electronic devices; and a liquid cold plate assembly. The liquid cold plate assembly includes a base portion mounted to the motherboard assembly, the base portion and motherboard assembly defining a volume that at least partially encloses the plurality of data center electronic devices; and a top portion mounted to the base portion and including a heat transfer member that includes a first number of inlet ports and a second number of outlet ports that are in fluid communication with a cooling liquid flow path defined through the heat transfer member, the first number of inlet ports being different that the second number of outlet ports.

An aspect combinable with the example implementation further includes a first thermal interface material positioned between a top surface of the base portion and at least a portion of the plurality of data center electronic devices; and a second thermal interface material positioned between the top surface of the base portion and a bottom surface of the top portion.

In another aspect combinable with any of the previous aspects, the liquid cold plate assembly further includes a plurality of heat transfer surfaces enclosed within the cooling liquid flow path.

In another aspect combinable with any of the previous aspects, the first number of inlet ports are greater than the second number of outlet ports.

In another aspect combinable with any of the previous aspects, the first number of inlet ports include at least two inlet ports positioned on opposed edges of the top portion of the liquid cold plate assembly.

In another aspect combinable with any of the previous aspects, the at least two inlet ports include at least four inlet ports positioned as pairs of inlet ports on opposed edges of the top portion of the liquid cold plate assembly.

Another aspect combinable with any of the previous aspects further includes a plurality of cooling liquid flow circuits defined by heat transfer surfaces positioned in the cooling liquid flow path.

In another aspect combinable with any of the previous aspects, the plurality of cooling liquid flow circuits extend between the at least two inlet ports and the second number of outlet ports.

Another aspect combinable with any of the previous aspects further includes at least one flow diverter positioned across one or more of the plurality of cooling liquid flow circuits.

In another aspect combinable with any of the previous aspects, the heat transfer surfaces include pin fins.

In another aspect combinable with any of the previous aspects, the plurality of data center electronic devices include at least one hardware processing device and a plurality of memory devices.

In another aspect combinable with any of the previous aspects, each of the plurality of memory devices is mounted to the motherboard between the at least one hardware processing device and at least one of the at least two inlet ports.

In another example implementation, a method for cooling heat generating devices in a data center includes circulating a flow of a cooling liquid to a server tray package. The server tray package includes a motherboard assembly that includes a plurality of data center electronic devices, and a liquid cold plate assembly that includes a base portion mounted to the motherboard assembly, the base portion and motherboard assembly defining a volume that at least partially encloses the plurality of data center electronic devices, and a top portion mounted to the base portion. The method includes circulating a flow of a cooling liquid into a first number of inlet ports of the heat transfer member; circulating the flow of the cooling liquid from the first number of inlet ports through a cooling liquid flow path defined through the heat transfer member to transfer heat from the plurality of data center electronic devices into the cooling liquid; and circulating the heated flow of the cooling liquid from the cooling liquid flow path to a second number of outlet ports of the heat transfer member, the first number of inlet ports being different that the second number of outlet ports.

An aspect combinable with the example implementation further includes transferring the heat from the plurality of data center electronic devices through a first thermal interface material positioned between the plurality of data center electronic devices and to a top surface of the base portion.

Another aspect combinable with any of the previous aspects further includes transferring the heat from the top surface of the base portion through a second thermal interface material positioned between a bottom surface of the top portion of the liquid cold plate assembly and to the cooling liquid.

In another aspect combinable with any of the previous aspects, circulating the flow of the cooling liquid through the cooling liquid flow path defined through the heat transfer member includes circulating the cooling liquid through a plurality of flow channels defined by a plurality of heat transfer surfaces enclosed within the cooling liquid flow path.

In another aspect combinable with any of the previous aspects, the first number of inlet ports are greater than the second number of outlet ports.

Another aspect combinable with any of the previous aspects further includes circulating the flow of the cooling liquid into at least two inlet ports positioned on opposed edges of the top portion of the liquid cold plate assembly.

Another aspect combinable with any of the previous aspects further includes circulating the flow of the cooling liquid into at least four inlet ports positioned as pairs of inlet ports on opposed edges of the top portion of the liquid cold plate assembly.

Another aspect combinable with any of the previous aspects further includes circulating the flow of the cooling liquid through a plurality of cooling liquid flow circuits defined by heat transfer surfaces positioned in the cooling liquid flow path that extend between the at least two inlet ports and the second number of outlet ports.

Another aspect combinable with any of the previous aspects further includes diverting at least a portion of the cooling liquid that flows within one or more of the plurality of cooling liquid flow circuits.

In another aspect combinable with any of the previous aspects, the heat transfer surfaces include pin fins.

In another aspect combinable with any of the previous aspects, the plurality of data center electronic devices include at least one hardware processing device and a plurality of memory devices.

Another aspect combinable with any of the previous aspects further includes circulating the flow of the cooling liquid from the first number of inlet ports over a portion of the cooling liquid flow path positioned above at least one of the plurality of memory devices; circulating the flow of the cooling liquid from the portion of the cooling liquid flow path positioned above at least one of the plurality of memory devices to another portion of the cooling liquid flow path positioned above the at least one hardware processing device; and circulating the flow of the cooling liquid from the another portion of the cooling liquid flow path positioned above the at least one hardware processing device to the second number of outlet ports.

Various implementations of a data center cooling system according to the present disclosure may include one, some, or all of the following features. For example, a server tray package according to the present disclosure may provide for direct liquid cooling to high heat generating electronic devices in a data center with uniform flow and uniform temperature of a cooling liquid that flows through a liquid cold plate assembly. As another example, a server tray package according to the present disclosure may provide for multiple functionality including cooling, mechanical rigidity, and liquid coolant sealing. As another example, a server tray package according to the present disclosure may provide for custom cooling liquid flow paths and flow geometries to cool both high and low heat generating electronic devices mounted on a single substrate. As a further example, a server tray package according to the present disclosure may allow for hot spot spreading in combination with high performance liquid cooling via cold plates. As another example, a server tray package according to the present disclosure may allow for higher power computing components (e.g., processors) to be cooled by direct conductive contact with a liquid cooled cold plate for better performance.

The details of one or more embodiments are set forth in the accompanying drawings and the description below. Other features, objects, and advantages will be apparent from the description and drawings, and from the claims.

DETAILED DESCRIPTION

In some example implementations, a cooling system, for example, for rack mounted electronic devices (e.g., servers, processors, memory, networking devices or otherwise) in a data center is disclosed. In various disclosed implementations, the cooling system may be or include a liquid cold plate assembly that is part of or integrated with a server tray package. In some implementations, the liquid cold plate assembly includes a base portion and a top portion that, in combination, form a cooling liquid flow path through which a cooling liquid is circulated and a thermal interface between one or more heat generating devices and the cooling liquid. The top portion of the liquid cold plate assembly may include multiple inlets and/or multiple outlets to customize a flow path through which a liquid coolant flows to cool the electronic devices in conductive thermal contact with the cold plate assembly.

Figure 1:
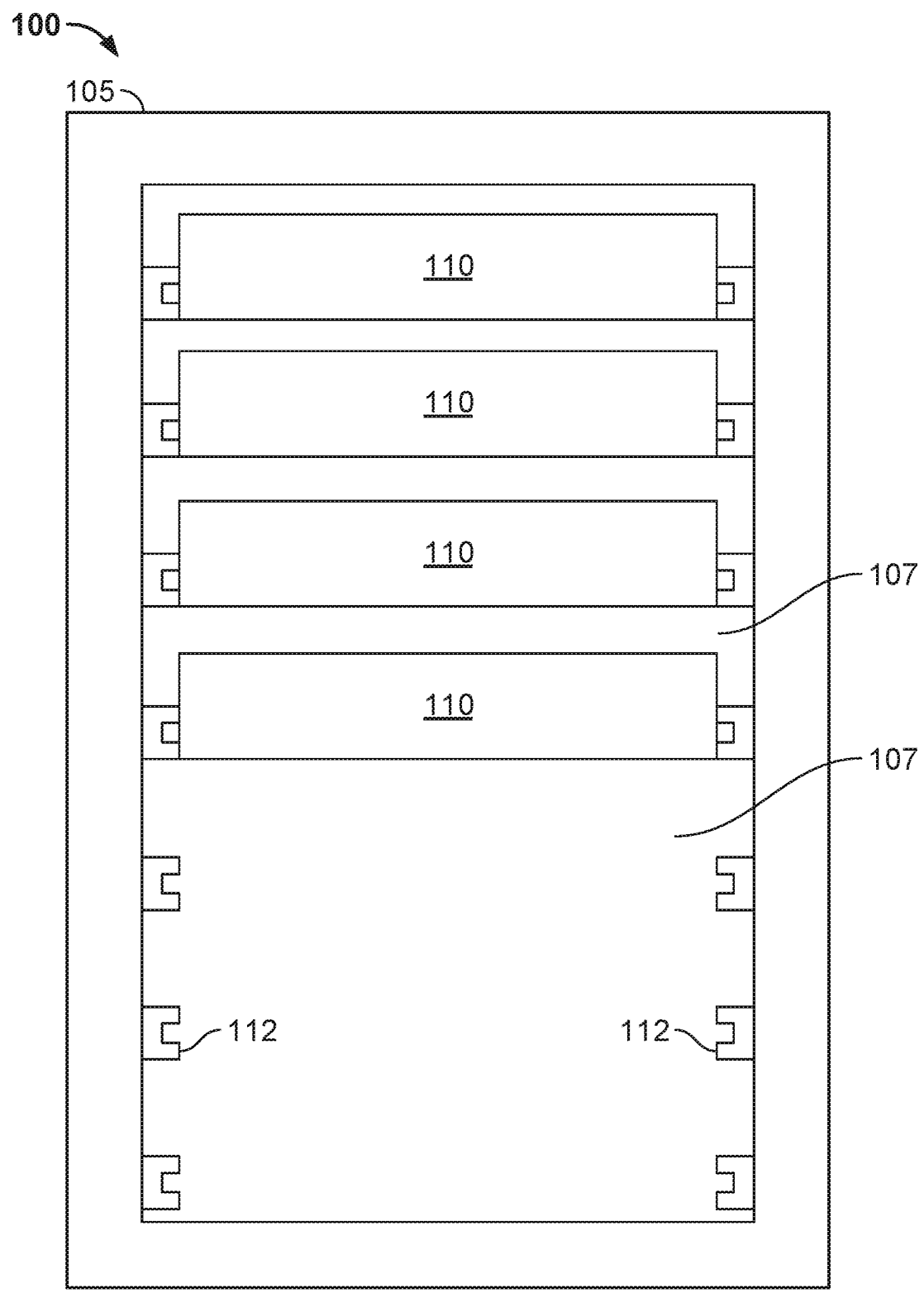
FIG. 1 illustrates a front view of a server rack and server rack sub-assemblies configured to mount within a rack used in a data center environment.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity). Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to the motherboard or other relatively flat structures appurtenant to a motherboard for supporting the motherboard in position in a rack structure. In some implementations, the server rack sub-assembly 110 may be a server tray package, server chassis, or server container (e.g., server box). In some implementations, the server rack sub-assembly 110 may be a hard drive cage.

Figure 2A:
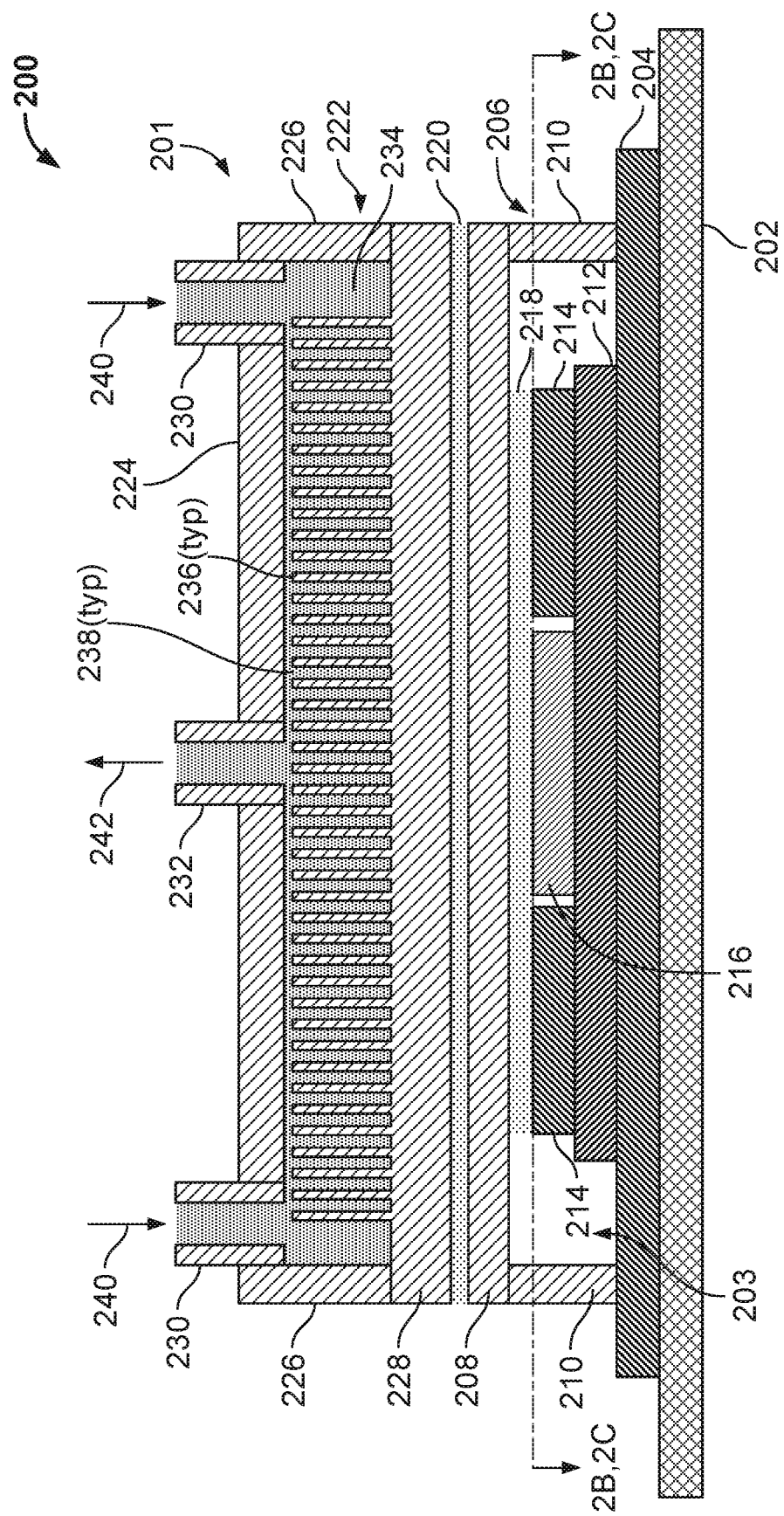
FIG. 2A illustrates a schematic cross-sectional side view of an example implementation of a server tray package that includes a liquid cold plate assembly.

FIG. 2A illustrates a schematic cross-sectional side view of an example implementation of a server tray package 200 that includes a liquid cold plate assembly 201. In some implementations, the server tray package 200 may be used as one or more of the server rack sub-assemblies 110 shown in FIG. 1. Referring to FIG. 2A, the server tray package 200 includes a printed circuit board 202 (e.g., motherboard 202) that supports one or more heat-generating data center electronic devices; in this example, two or more memory modules 214 and one or more processing devices 216 (e.g., one or more application-specific integrated circuits (ASIC)). In some aspects, the motherboard 202 may be mounted on a frame (not shown), which can include or simply be a flat structure that can be grasped by technicians for moving the motherboard 202 into place and holding it in position within the rack 105. For example, the server tray package 200 may be mounted horizontally in the server rack 105 such as by sliding the frame into the slot 107 and over a pair of rails in the rack 105 on opposed sides of the server tray package 200—much like sliding a lunch tray into a cafeteria rack. The frame can extend below the motherboard 202 or can have other forms (e.g., by implementing it as a peripheral frame around the motherboard 202) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 202 is mounted on a frame; alternatively, multiple motherboards 202 may be mounted on a frame, depending on the needs of the particular application. In some implementations, one or more fans (not shown) can be placed on the motherboard 202 or a frame so that air enters at the front edge of the server tray package 200, closer to the front of the rack 105 when the server tray package 200 is installed in the rack 105, flows over the motherboard 202, over some of the data center electronic components on the motherboard 202, and is exhausted from the server tray package 200 at the back edge, closer to the back of the rack 105 when the server tray package 200 is installed in the rack 105. The one or more fans can be secured to the motherboard 202 or a frame by brackets.

As illustrated, a substrate 204 and an interposer 212 (e.g., a silicon interposer) are positioned between the data center electronic devices 214 and 216 and the motherboard 202. The substrate 204, for example, provides an interface between one or more of the data center electronic devices (e.g., the processing device 216) and the motherboard 202, such as through pins that provide electrical and communication interfaces. The substrate 204 also, in this example, may provide a mounting location for one or more components of the liquid cold plate assembly 201. The interposer 212, for example, provides a high bandwidth connection between the data center electronic devices, such as between the memory modules 214 and the processing device 216.

Figure 2B:
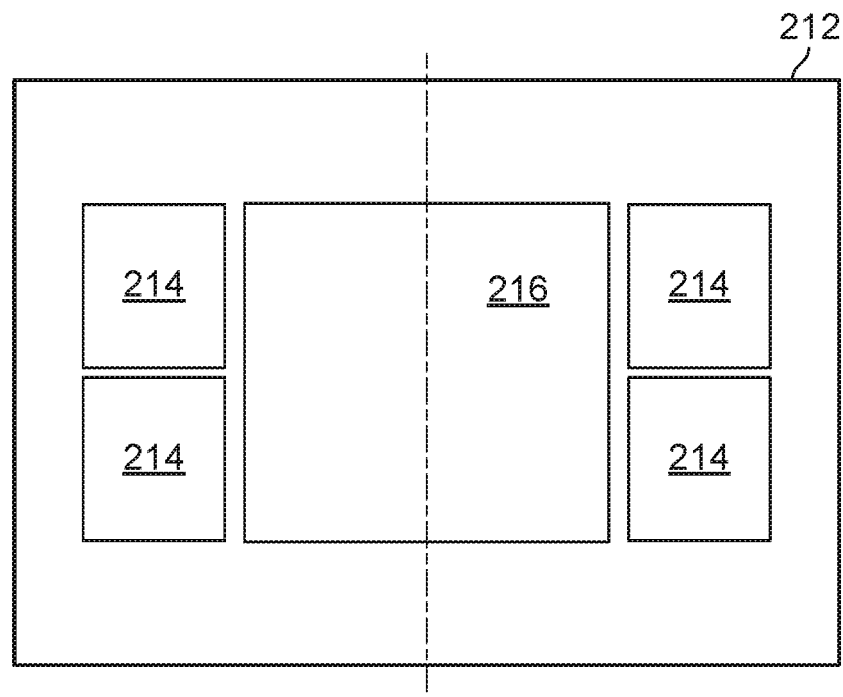
FIG. 2B illustrates a schematic cross-sectional top view of an example of a portion of the example implementation of a server tray package that includes a liquid cold plate assembly.

For example, as shown in FIG. 2B, in some examples, there is a single processing device 216 mounted on the interposer 212 and at or near a center of the interposer 212 (e.g., such that centers of the processing device 216 and the interposer 212 are aligned). Memory modules 214, in this example, are positioned (in pairs) on only two opposed sides of the processing device 216. Thus, more heat may be generated (e.g., by the processing device 216) at or near a center portion of the interposer 212 relative to a perimeter area of the interposer 212 (e.g., in which the memory modules 214 are mounted).

Figure 2C:
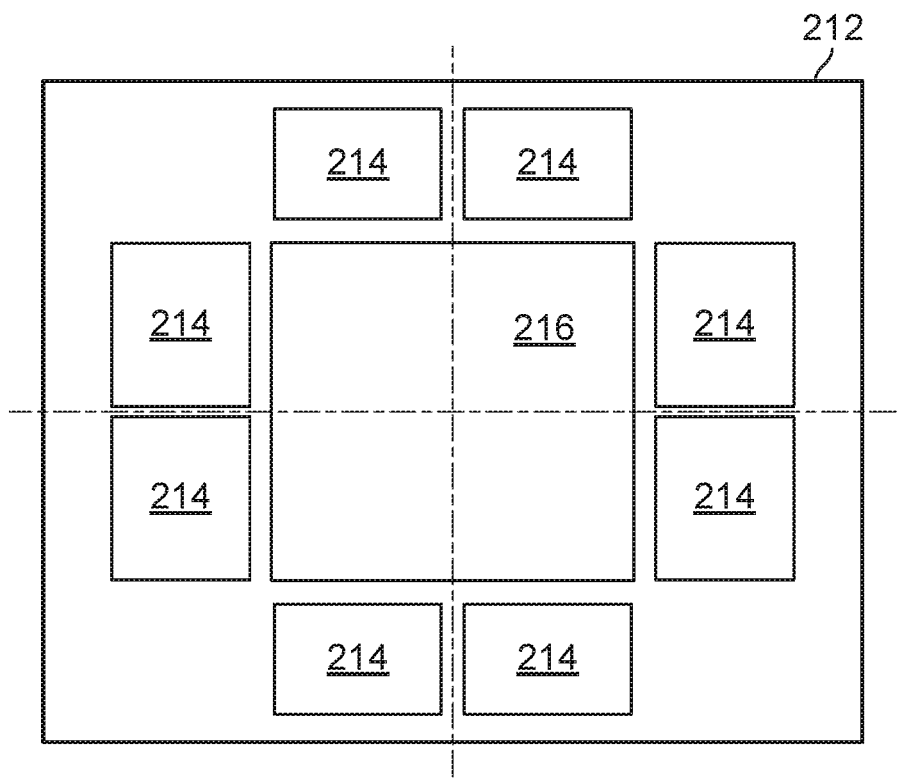
FIG. 2C illustrates a schematic cross-sectional top view of another example of a portion of the example implementation of a server tray package that includes a liquid cold plate assembly.

As another example, as shown in FIG. 2C, in some examples, there is a single processing device 216 mounted on the interposer 212 and at or near a center of the interposer 212 (e.g., such that centers of the processing device 216 and the interposer 212 are aligned). Memory modules 214, in this example, are positioned (in pairs) on all four opposed sides of the processing device 216. Thus, more heat may be generated (e.g., by the processing device 216) at or near a center portion of the interposer 212 relative to a perimeter area of the interposer 212 (e.g., in which the memory modules 214 are mounted).

As shown in FIG. 2A, the liquid cold plate assembly 201 includes a top portion 222, also referred to as a top hat 222, and a base portion 206. The base portion 206 includes a lid 208 that defines a top surface of the base portion 206 and sides 210 that couple the lid 208 to the substrate 204. In combination, the lid 208 and the sides 210 define or enclose a volume 203 in which the interposer 212 and the data center electronic devices 214 and 216 (mounted thereon) are positioned in the server tray package 200. As shown in this example, a thermal interface material 218 (e.g., a phase change material or otherwise thermally conductive material) is contactingly positioned between a bottom side of the lid 208 and the data center electronic devices 214 and 216 to provide a conductive heat transfer interface between these components.

In this example implementation, the top hat 222 is mounted to a top surface of the lid 208 through another thermal interface material 220 (e.g., a phase change material or otherwise thermally conductive material) that provides a conductive heat transfer interface between a bottom 228 of the top hat 222 and the lid 208 of the base portion 206. The top hat 222, as shown, includes a cap 224 that is connected to the bottom 228 through sides 226. In combination, the cap 224, sides 226, and bottom 228 define a volume 234 through which a flow of a cooling liquid may be circulated.

As shown in this example, the cap 224 includes at least two cooling liquid inlets 230 through which a supply 240 of cooling liquid may enter. The cap 224 also includes (in this example) a single cooling liquid outlet 232 through which a return 242 of cooling liquid may exit. Thus, in this implementation, there is a two-to-one ratio of inlets 230 to outlets 232. In some aspects, such a ratio may be implemented but with different quantities of inlets 230 and outlets 232. For example, there may be four inlets 230 and two outlets 232. Other quantities and ratios of inlets 230 to outlets 232 are also possible (e.g., four inlets 230 to one outlet 232).

In FIG. 2A, as further shown in this example, the inlets 230 are each placed at or near a perimeter edge of the top hat 222, while the single outlet 232 is positioned at or near a center of the top hat 222. Other positions of the inlets 230 and the outlet 232 are also contemplated by the present disclosure, such as, for example, both inlets 230 positioned near the center of the top hat 222 and one or more outlets 232 positioned at or near the perimeter edge of the top hat 222.

The volume 234 defines or includes a cooling liquid flow path between the inlets 230 and the outlets 232. As shown in this example, one or more heat transfer surfaces 236 (e.g., fins, undulations, ridges, or other extended surfaces that increase a heat transfer area) are positioned in the volume 234. The heat transfer surfaces 236 define channels 238, for example, through which the cooling liquid may be circulated to increase an amount of heat transferred from the data center electronic devices 214 and 216 to the cooling liquid (e.g., relative to an amount transferred in an implementation of the server tray package 200 that does not include the heat transfer surfaces 236).

Figure 3:
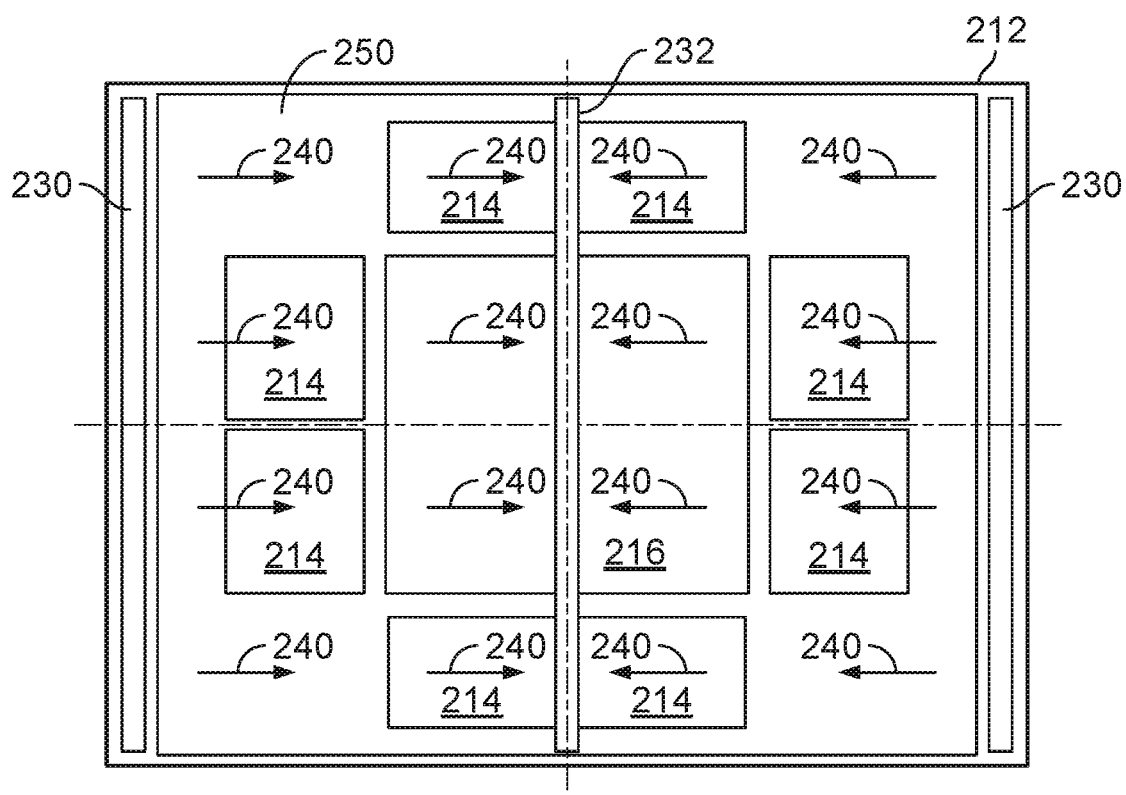
FIG. 3 illustrates a schematic cross-sectional top view of another example of a portion of the example implementation of a server tray package that includes a liquid cold plate assembly.

Turning briefly to FIG. 3, this top view of the example implementation of the server tray package 200 shown in FIGS. 2A and 2C further shows the two cooling liquid inlets 230 and the single cooling liquid outlet 232. In this example, each inlet 230 is shaped as a rectangular opening with a length generally commiserate with a dimension of the interposer 212 and a width much less than the length. Here, each of the two inlets 230 is positioned on a particular edge of the perimeter of the top hat 222 (and vertically above a corresponding edge of the interposer 212). The single outlet 232, positioned from one edge of the top hat 222 to an opposed edge of the top hat 222 also has a similar opening shape as the inlets 230. Here, heat transfer area 250 represents the portion of the bottom 228 which is in conductive thermal contact with the heat generating devices (processor 216, memory modules 214, and others) through the top 208 of the base portion 206.

In an example operation of the server tray package 200 to cool the data center electronic devices 214 and 216, the server tray package 200 may be deployed, for example, in a data center server rack 105 in a data center. During operation of the server tray package 200, the processing device 216 and memory modules 214 generate heat that may need to be dissipated or removed from the server tray package 200 (e.g., for proper operation of the server tray package 200). Heat generated by the processing device 216 and memory modules 214 is transferred through the thermal interface material 218 and to the lid 208 of the base portion 206 of the liquid cold plate assembly 201. The transferred heat is further transferred from the lid 208, through the thermal interface material 220, and to the bottom 228 of the top hat 222. In some examples, one or more components of the liquid cold plate assembly 201 may be formed or made from a thermally conductive material, such as copper, aluminum, a combination of copper and aluminum, or other thermally conductive materials.

The heat transferred to the bottom 228 of the top hat 222 is then transferred to the supply 240 of the cooling liquid that is circulated through the inlets 230 and into the volume 234 of the top hat 222. In some examples, the cooling liquid may be a chilled water or glycol, such as from one or more chillers fluidly coupled to the server tray package 200. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 240 may be at an appropriate temperature and flow rate to remove a desired amount of heat from the data center electronic devices 214 and 216.

In some examples, heat is transferred directly from the bottom 228 to the cooling liquid supply 240. Heat may also be transferred from the bottom 228, through one or more heat transfer surfaces 236, and then to the cooling liquid supply 240 that flows through channels 238. As shown in FIG. 3, the supply 240 of the cooling liquid first flows through a portion of the volume 234 that is vertically above the memory modules 214 (on two sides). Some of the supply 240 of the cooling liquid, after receiving heat generated by the memory modules 214, flows through another portion of the volume 234 that is vertically above the processing device 216 and then to the outlet 232 (now heated by the memory module(s) 214 and processing device 216). Some of the supply 240 of the cooling liquid, after receiving heat generated by the memory modules 214, flows to the outlet 232 and through the outlet 232 as return 242 of the cooling liquid (now heated by the memory modules 214).

The heated cooling liquid supply 240 is circulated to the outlet 232 and exits the top hat 222 as the cooling liquid return 242 (e.g., that is at a higher temperature than the cooling liquid supply 240). The cooling liquid return 242 is circulated back, e.g., to a source of the cooling liquid, to expel the heat (e.g., in a chiller, cooling tower, or other heat exchanger) from the return 242.

Figure 4A:
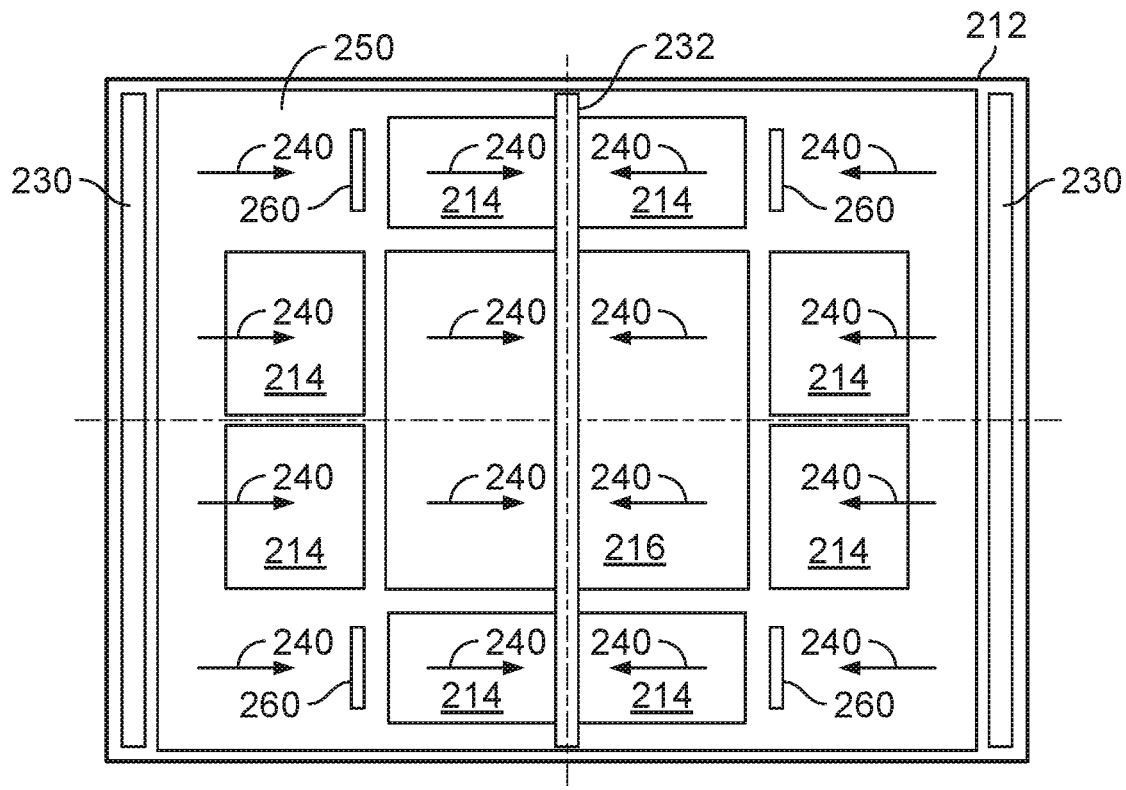
FIG. 4A illustrates a schematic cross-sectional top view of another example of a portion of the example implementation of a server tray package that includes a liquid cold plate assembly.

FIG. 4A illustrates a schematic cross-sectional top view of another example of a portion of the example implementation of a server tray package 200 that includes a liquid cold plate assembly 201. In this example, one or more flow diverters 260 are mounted within the volume 234 on a top surface of the bottom 228 of the top hat 222. As shown in this example, four flow diverters 260 are mounted within the volume 234 to impede the supply 240 of the cooling liquid as it flows from the inlets 230 toward the outlet 232. In this example, the flow diverters 260 are positioned to impede a flow of the supply 240 of the cooling liquid that flows only over one or more memory modules 214 between a particular one of the inlets 230 to the outlet 232. In some aspects, the flow diverters 260 may promote temperature uniformity of the supply 240 of the cooling liquid at the outlet 232.

Figure 4B:
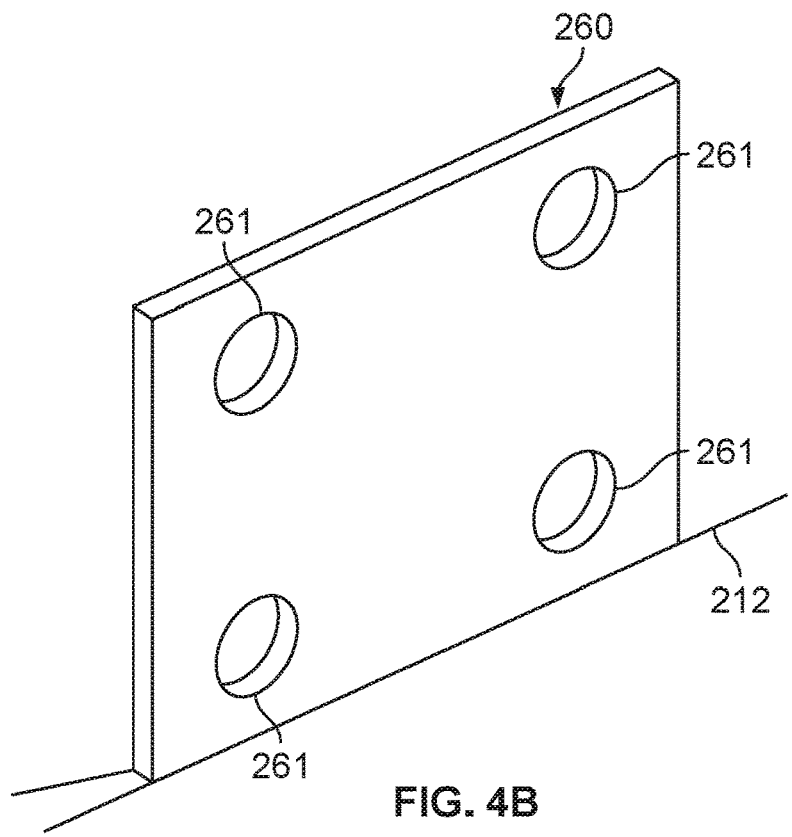
FIG. 4B illustrates an example flow diverter of a liquid cold plate assembly.

In some example implementations, the flow diverter 260 is shaped as a solid wall that, for example, extends all or partially from the bottom 228 of the top hat 222 toward the cap 224. FIG. 4B illustrates an example flow diverter 260 in which one or more perforations 261 are formed in the flow diverter 260. In some aspects, the perforations 261 may be designed to promote flow and temperature uniformity of the supply 240 of the cooling liquid at the outlet 232.

Figure 5:
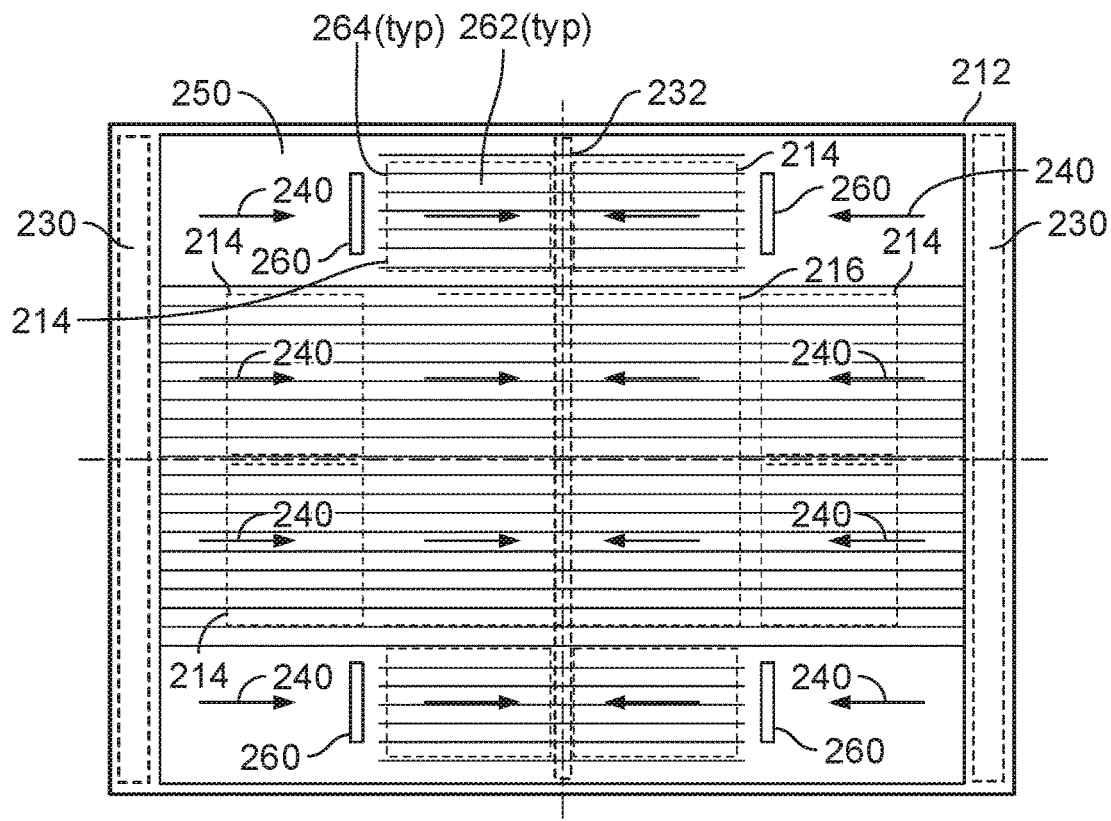
FIG. 5 illustrates a schematic cross-sectional top view of another example of a portion of the example implementation of a server tray package that includes a liquid cold plate assembly.

FIG. 5 illustrates a schematic cross-sectional top view of another example of a portion of the example implementation of the server tray package 200 that includes the liquid cold plate assembly 201. In this example implementations, flow circuits 262 are formed in a surface of the bottom 228 of the top hat 222. In this example, the flow circuits 262 are formed by ridges 264 formed in the surface of the bottom 228. Alternatively, the circuits 262 may be formed as troughs embedded in the surface of the bottom 228. The flow circuits 262, are oriented in this example in a parallel or substantially parallel direction of flow of the supply 240 of the cooling liquid from the inlets 230 to the outlet 232. In this example, the flow circuits 262 are formed from one edge of the bottom 228 that is orthogonal to the direction of flow to an opposed edge of the bottom 228 (in this drawing, from top edge of the heat transfer area 250 to bottom edge of the heat transfer area 250). In operation, the flow circuits 262 may channel the flow of the supply 240 of the cooling liquid as it circulates from the inlets 230 toward the outlet, thereby, e.g., promoting heat transfer of heat from the bottom 228 into the supply 240 of the cooling liquid.

Figure 6:
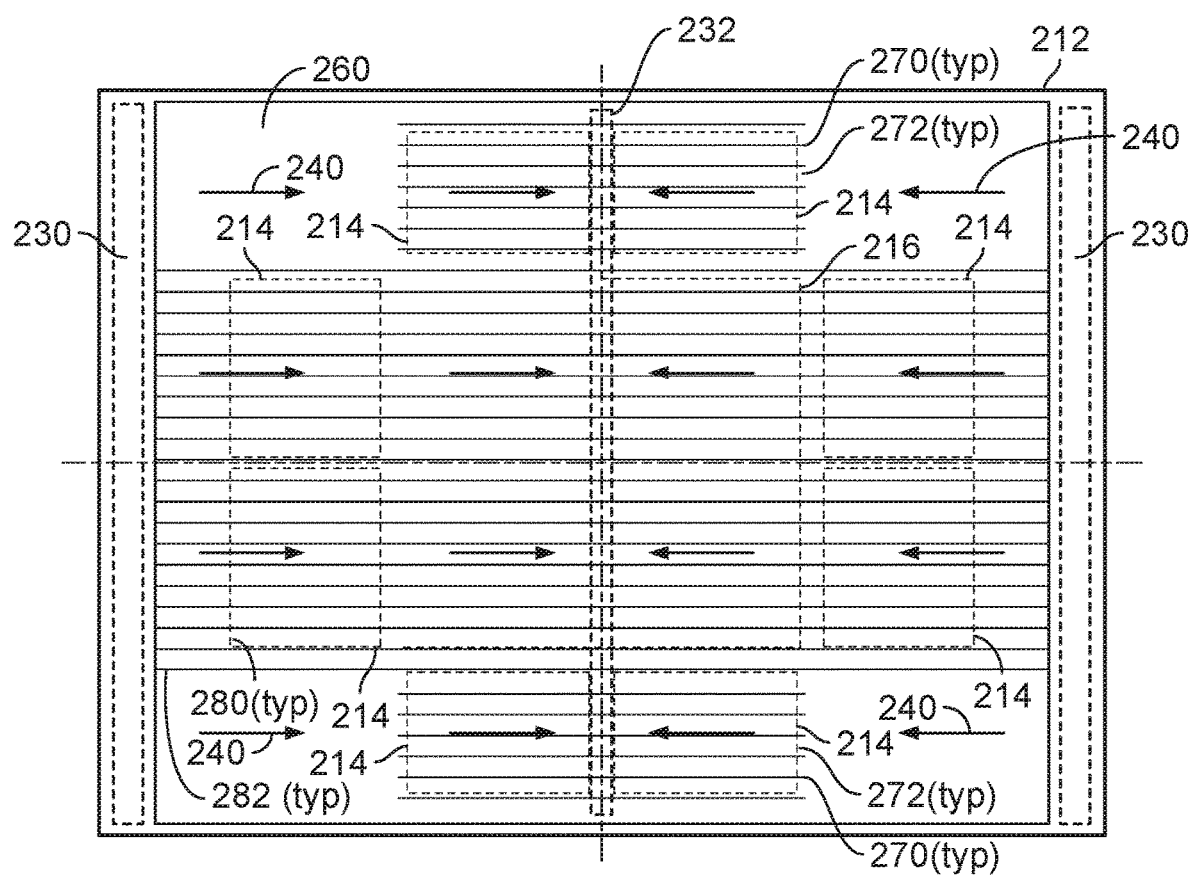
FIG. 6 illustrates a schematic cross-sectional top view of another example of a portion of the example implementation of a server tray package that includes a liquid cold plate assembly.

FIG. 6 illustrates a schematic cross-sectional top view of another example of a portion of the example implementation of the server tray package 200 that includes the liquid cold plate assembly 201. In this example implementation, flow circuits 272 and 282 are formed in a surface of the bottom 228 of the top hat 222. In this example, the flow circuits 272 are formed by ridges 270 formed in the surface of the bottom 228, and the flow circuits 282 are formed by ridges 280 formed in the surface of the bottom 228. Alternatively, the circuits 272 and 282 may be formed as troughs embedded in the surface of the bottom 228. As shown in this example, flow circuits 272 are more closely spaced (e.g., a higher pitch) relative to the flow circuits 282. Also, as shown, the flow circuits 272 are formed in the heat transfer area 250 above portions of the bottom 228 that are vertically above only memory modules 214 on the interposer 212. The flow circuits 282 are formed in the heat transfer area 250 above portions of the bottom 228 that are vertically above memory modules 214 and the processing device 216 on the interposer 212.

The flow circuits 272 and 282 are oriented in this example in a parallel or substantially parallel direction of flow of the supply 240 of the cooling liquid from the inlets 230 to the outlet 232. In this example, the flow circuits 272 and 282 are formed from one edge of the bottom 228 that is orthogonal to the direction of flow to an opposed edge of the bottom 228 (in this drawing, from top edge of the heat transfer area 250 to bottom edge of the heat transfer area 250). In operation, the flow circuits 272 and 282 may channel the flow of the supply 240 of the cooling liquid as it circulates from the inlets 230 toward the outlet, thereby, e.g., promoting heat transfer of heat from the bottom 228 into the supply 240 of the cooling liquid.

Figure 7:
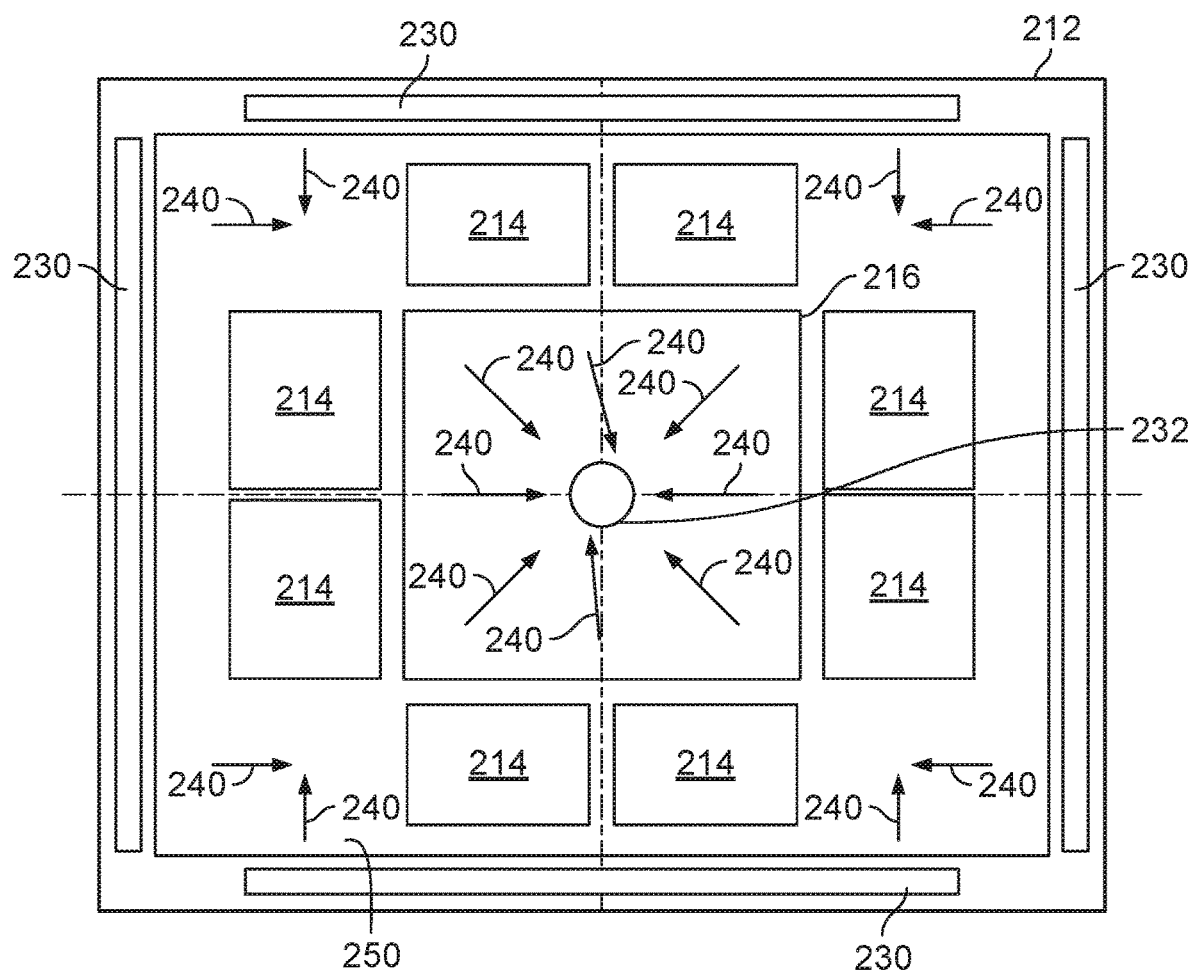
FIG. 7 illustrates a schematic cross-sectional top view of another example of a portion of the example implementation of a server tray package that includes a liquid cold plate assembly.

Turning to FIG. 7, this figure illustrates a schematic cross-sectional top view of another example of a portion of the example implementation of the server tray package 200 that includes the liquid cold plate assembly 201. As shown in this example, there are four inlets 230, each of which is positioned at a perimeter edge of the top hat 222. There is a single outlet 232 (shown as a circular cross-sectional outlet in this example) positioned in the center of the heat transfer area 250 of the top hat 222. Thus, during operation of the liquid cold plate assembly 201 in FIG. 7, the supply 240 flows in the volume 234 in a direction from the inlets 230 and toward a center of the top hat 222 where the outlet 232 is located. In this example, all or much of the supply 240 of the cooling liquid flows first within a portion of the volume 234 vertically above one or more memory modules 214 and then within another portion of the volume 234 vertically above the processing device 216 to receive heat from the devices, through the bottom 228 and into the cooling liquid.

Figure 8:
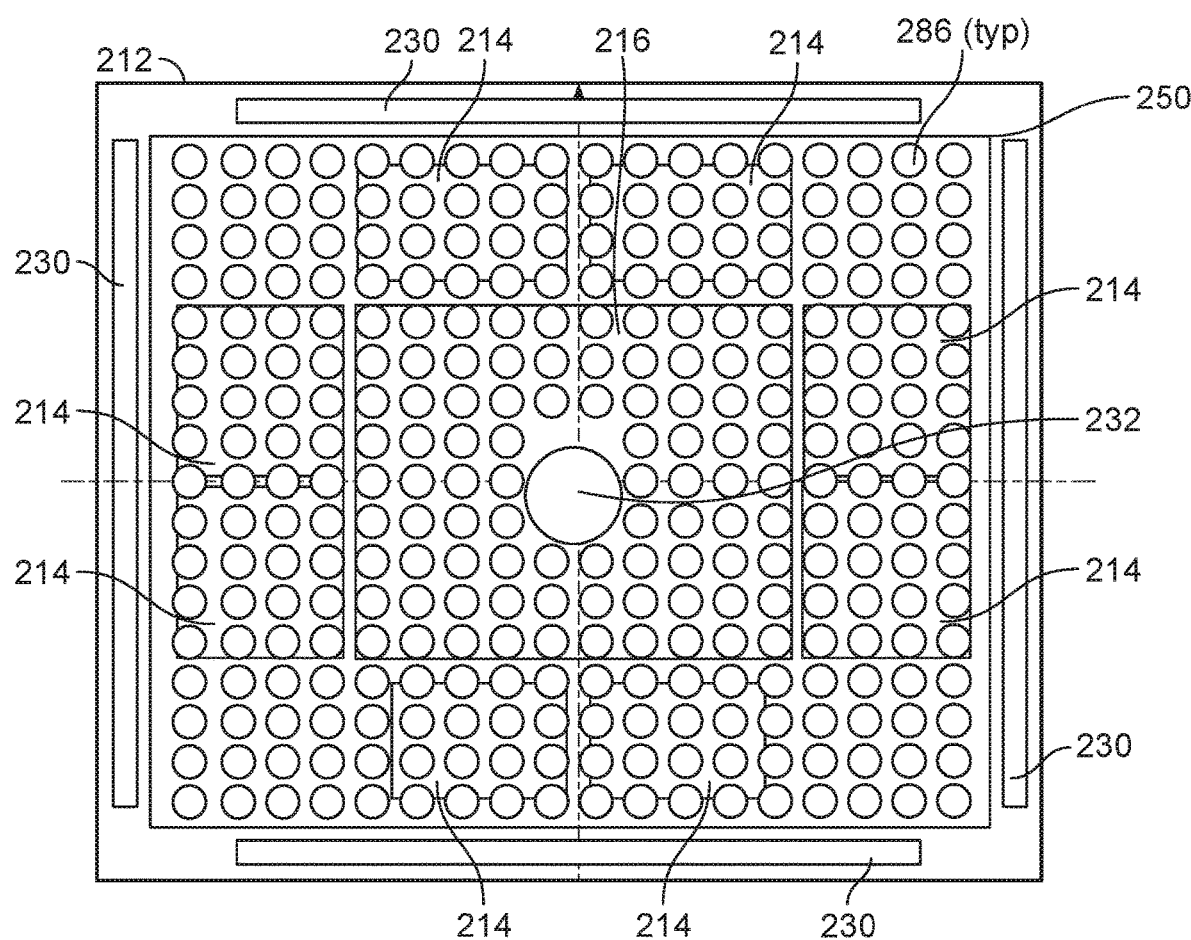
FIG. 8 illustrates a schematic cross-sectional top view of another example of a portion of the example implementation of a server tray package that includes a liquid cold plate assembly.

Turning to FIG. 8, the implementation of the liquid cold plate assembly 201 is shown (e.g., with four inlets 230 and a single, center outlet 232) with multiple pin fins 286 mounted onto the bottom 228 of the top hat 222 within the volume 234. As shown, the pin fins 286 define multiple tortuous flow paths for the supply 240 of the cooling liquid to flow through from the inlets 230 to the outlet 232. In this example, the pin fins 286 may cover all or most of the heat transfer area 250 and, for instance, extend from the bottom 228 to the cap 224. In alternative implementations, there may be some portions of the heat transfer area 250 that do not include pin fins 286. In alternative implementations, the pin fins 286 my only extend partially from the bottom 228 into the volume 234 and toward the cap 224.

Figure 9:
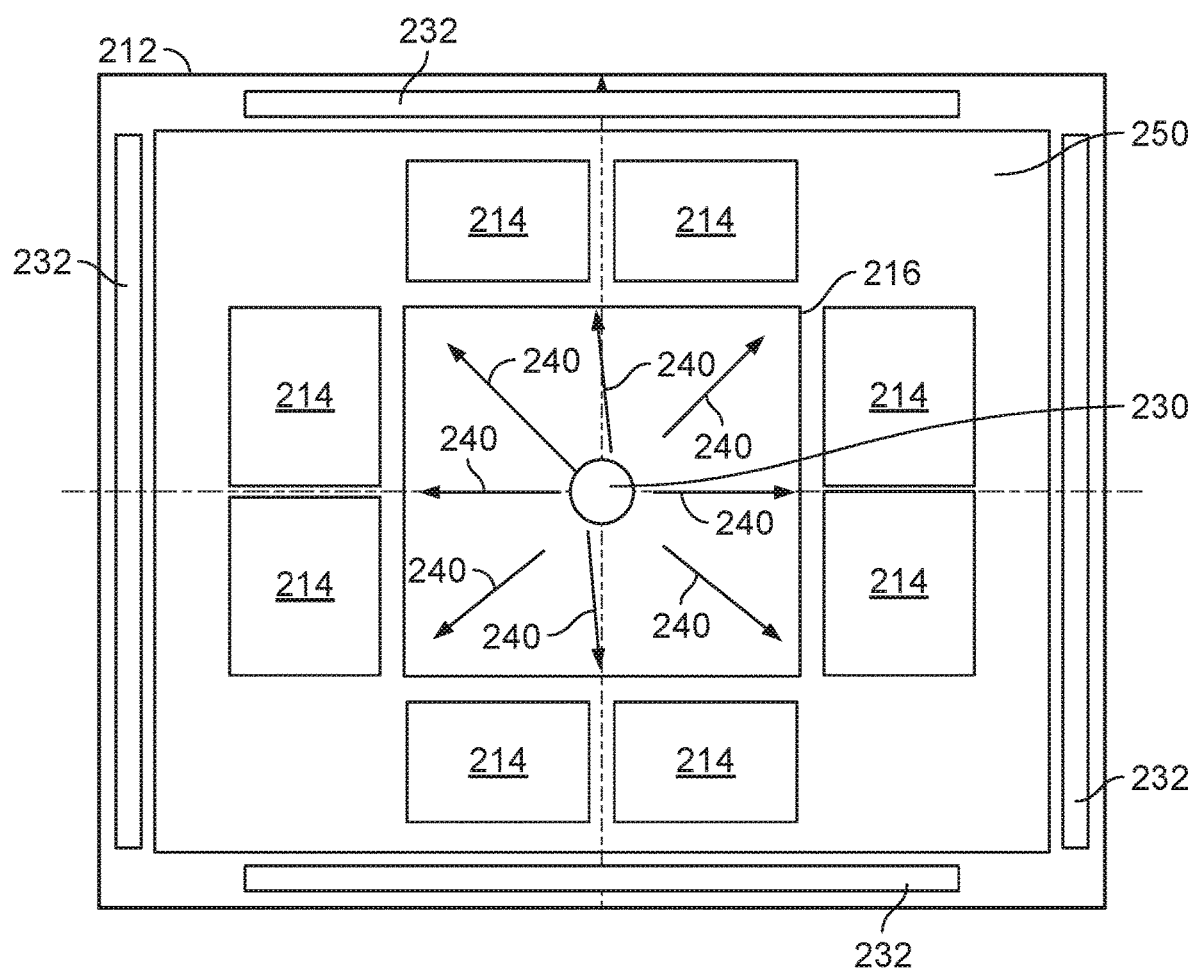
FIG. 9 illustrates a schematic cross-sectional top view of another example of a portion of the example implementation of a server tray package that includes a liquid cold plate assembly.

FIG. 9 illustrates a schematic cross-sectional top view of another example of a portion of the example implementation of the server tray package 200 that includes the liquid cold plate assembly 201. In this example implementation, the number and ratio of inlets 230 to outlets 232 are reversed as compared to the implementation shown in FIG. 7. For example, FIG. 9 shows an implementation of the liquid cold plate assembly 201 and specifically the top hat 222 in which there is a single cooling liquid inlet 230 located at or near a center of the heat transfer area 250 (and the cap 224), while there are four cooling liquid outlets 232, each of which is positioned at a perimeter edge of the top hat 222. Thus, during operation of the liquid cold plate assembly 201 in FIG. 9, the supply 240 flows in the volume 234 in a direction from the inlet 230 and toward a perimeter of the top hat 222 where the outlets 232 are located. In this example, all or much of the supply 240 of the cooling liquid flows first within a portion of the volume 234 vertically above the processing device 216 and then within another portion of the volume 234 vertically above the memory modules 214 to receive heat from the devices, through the bottom 228, and into the cooling liquid.

A number of embodiments have been described. Nevertheless, it will be understood that various modifications may be made without departing from the spirit and scope of what is described. For example, the steps of example operations of example methods and processes described herein may be performed in other orders, some steps may be removed, and other steps may be added. Accordingly, other embodiments are within the scope of the following claims.

What is claimed is:

1. A server tray package, comprising:
 a motherboard assembly that comprises a plurality of data center electronic devices;
 a liquid cold plate assembly that comprises:
  a base portion mounted to the motherboard assembly, the base portion and motherboard assembly defining a volume that at least partially encloses the plurality of data center electronic devices, the plurality of data center electronic devices comprising a first data center electronic device having a first heat output and a second data center electronic device having a second heat output greater than the first heat output; and
  a top portion mounted to the base portion and comprising a heat transfer member that comprises at least two inlet ports positioned on opposed edges of the top portion of the liquid cold plate assembly, each of the at least two inlet ports extending along a length of a respective opposed edge of the top portion, and at least one outlet port, wherein the at least two inlet ports and the at least one outlet port are in fluid communication with a cooling liquid flow path defined through the heat transfer member;
 a plurality of cooling liquid flow circuits defined by a plurality of heat transfer surfaces positioned in the cooling liquid flow path, the plurality of cooling liquid flow circuits extending between the at least two inlet ports and the at least one outlet port and oriented in a direction transverse to the length of the opposed edges; and
 at least one flow diverter positioned adjacent at least one of the plurality of cooling liquid flow circuits to impede at least a portion of a flow of a cooling liquid from the at least one of the cooling liquid flow circuits that is upstream of the first data center electronic device, and the at least one flow diverter diverts the at least the portion of the flow of the cooling liquid towards another of the cooling liquid flow circuits that is upstream of the second data center electronic device.

2. The server tray package of claim 1, further comprising:
 a first thermal interface material positioned between a top surface of the base portion and at least a portion of the plurality of data center electronic devices; and
 a second thermal interface material positioned between the top surface of the base portion and a bottom surface of the top portion.

3. The server tray package of claim 1, wherein the plurality of heat transfer surfaces comprise ridges.

4. The server tray package of claim 1, wherein a number of the at least two inlet ports is at least twice a number of the at least one outlet port.

5. The server tray package of claim 1, wherein the at least two inlet ports comprise at least four inlet ports positioned as pairs of inlet ports on opposed edges of the top portion of the liquid cold plate assembly.

6. The server tray package of claim 1, wherein the plurality of heat transfer surfaces comprise pin fins.

7. The server tray package of claim 1, wherein the second data center electronic device comprises a hardware processing device and the first data center electronic device comprises a memory device.

8. The server tray package of claim 1, wherein the at least one outlet port is positioned at a centerline of the top portion and extending parallel to the at least two inlet ports.

9. The server tray package of claim 1, wherein the at least one flow diverter comprises an aperture formed therethrough.

10. The server tray package of claim 9, wherein another portion of the flow of the cooling liquid is circulated through the aperture and into the at least one cooling liquid flow circuit upstream of the first data center electronic device.

11. The server tray package of claim 9, wherein the at least one flow diverter comprises a wall structure.

12. A method for cooling a plurality of data center electronic devices in a data center, comprising:
 circulating a flow of a cooling liquid to a server tray package that comprises:
  a motherboard assembly that comprises the plurality of data center electronic devices, the plurality of data center electronic devices comprising at least one hardware processing device and at least one memory device, and
  a liquid cold plate assembly that comprises a base portion mounted to the motherboard assembly, the base portion and motherboard assembly defining a volume that at least partially encloses the plurality of data center electronic devices, and a top portion mounted to the base portion, the top portion comprising a heat transfer member;
 circulating a flow of the cooling liquid into at least two inlet ports of the heat transfer member, the at least two inlet ports positioned on opposed edges of the top portion of the liquid cold plate assembly, each of the at least two inlet ports extending along a length of a respective one of the opposed edges of the top portion;
 circulating the flow of the cooling liquid from the at least two inlet ports through a cooling liquid flow path defined through the heat transfer member to transfer heat from the plurality of data center electronic devices into the cooling liquid, the cooling liquid flow path comprising a plurality of flow channels defined by heat transfer surfaces positioned in the cooling liquid flow path that extend between the at least two inlet ports and at least one outlet port and oriented in a direction transverse to the length of the opposed edges, the circulating comprising:
  circulating a portion of the flow of the cooling liquid from the at least two inlet ports toward a first flow channel of the plurality of flow channels that is upstream of the at least one memory device;
  diverting at least a part of the portion of the cooling liquid that flows toward the first flow channel toward a second flow channel of the plurality of flow channels that is upstream of the at least one hardware processing device; and
  circulating the heated flow of the cooling liquid from the first and second flow channels of the cooling liquid flow path to the at least one outlet port of the heat transfer member.

13. The method of claim 12, further comprising:
  transferring the heat from the plurality of data center electronic devices through a first thermal interface material and to a top surface of the base portion, the first thermal interface material positioned between the plurality of data center electronic devices and the top surface of the base portion; and
  transferring the heat from the top surface of the base portion through a second thermal interface material, to a bottom surface of the top portion of the liquid cold plate assembly, and then to the cooling liquid, the second thermal interface material positioned between the top surface of the base portion and the bottom surface of the top portion of the liquid cold plate assembly.

14. The method of claim 12, wherein a number of the at least two inlet ports is at least twice a number of the at least one outlet port.

15. The method of claim 12, wherein the at least two inlet ports comprises at least four inlet ports, and circulating the flow of the cooling liquid comprises circulating the flow of the cooling liquid into the at least four inlet ports positioned as pairs of inlet ports on pairs of the opposed edges of the top portion of the liquid cold plate assembly.

16. The method of claim 12, wherein the heat transfer surfaces comprise pin fins.

17. The method of claim 11, further comprising:
  circulating the diverted flow of the cooling liquid through the second flow channel;
  circulating another portion of the flow of the cooling liquid from the at least two inlet ports to and through the second flow channel;
  circulating the diverted flow and the another portion of the flow of the cooling liquid from the second flow channel and to the at least one outlet port.

18. The method of claim 12, wherein the diverting the at least part of the portion of the cooling liquid that flows toward the first flow channel toward the second flow channel comprises diverting the at least part of the portion of the cooling liquid with at least one flow diverter positioned upstream of the first flow channel.

19. The method of claim 18, further comprising circulating another part of the portion of the cooling liquid that flows toward the first flow channel through at least one aperture of the at least one flow diverter and through the first flow channel.

20. The method of claim 12, wherein the at least one memory device comprises a first heat output and the at least one hardware processing device comprises a second heat output greater than the first heat output.

* * * * *